(12) United States Patent
Saito et al.

(10) Patent No.: US 10,651,617 B1
(45) Date of Patent: May 12, 2020

(54) ROTARY CONNECTOR AND METHOD FOR ASSEMBLING SAME

(71) Applicant: ALPS ALPINE CO., LTD., Tokyo (JP)

(72) Inventors: Kengo Saito, Miyagi (JP); Toshiaki Asakura, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/752,808

(22) Filed: Jan. 27, 2020

Related U.S. Application Data

(63) Continuation of application No. PCT/JP2018/016650, filed on Apr. 24, 2018.

(30) Foreign Application Priority Data

Aug. 22, 2017 (JP) ................................. 2017-159703

(51) Int. Cl.
*H01R 3/00* (2006.01)
*H01R 35/02* (2006.01)
*H01R 35/04* (2006.01)
*H01R 43/20* (2006.01)
*H05K 1/02* (2006.01)
(Continued)

(52) U.S. Cl.
CPC ......... *H01R 35/025* (2013.01); *B60R 16/027* (2013.01); *H01B 7/04* (2013.01); *H01R 35/04* (2013.01); *H01R 43/20* (2013.01); *H05K 1/028* (2013.01); *H01R 2201/26* (2013.01)

(58) Field of Classification Search
CPC ... B60R 16/023; B60R 16/027; H01R 35/025; H01R 35/04; H01R 43/20; H01R 2201/26; H05K 1/028

USPC .......................................................... 439/164
See application file for complete search history.

(56) References Cited

U.S. PATENT DOCUMENTS 9,673,585 B2 * 6/2017 Tsushima .............. B60R 16/027
2004/0067670 A1 4/2004 Rhein et al.
2016/0336704 A1 11/2016 Tsushima et al.
(Continued)

FOREIGN PATENT DOCUMENTS

JP H08-213131 8/1996
JP 2006-502549 1/2006
(Continued)

OTHER PUBLICATIONS

International Search Report for PCT/JP2018/016650 dated Jul. 17, 2018.

*Primary Examiner* — Khiem M Nguyen
(74) *Attorney, Agent, or Firm* — IPUSA, PLLC

(57) ABSTRACT

A rotary connector includes a fixed housing having an outer cylindrical section, a movable housing, having an inner cylindrical section, and rotatably connected to the fixed housing, a main cable accommodated inside an annular space formed between the outer cylindrical section and the inner cylindrical section, a sub cable having one end connected to one end of the main cable and the other end connected to an external terminal, and a lead block. The lead block has a first block, to which the one end of the main cable and the one end of the sub cable are fixed, and a second block, which is fixed at an arrangement angle crossing an angle at which the first block is arranged, and to which the other end of the sub cable and the external terminal are fixed.

20 Claims, 20 Drawing Sheets

(51) Int. Cl.
*H01B 7/04* (2006.01)
*B60R 16/027* (2006.01)

(56) References Cited

U.S. PATENT DOCUMENTS

2019/0221979 A1* 7/2019 Hirai ..................... H01R 35/04
2019/0372287 A1* 12/2019 Yamanishi ........... H01R 35/025

FOREIGN PATENT DOCUMENTS

| JP | 2013-219007 | 10/2013 |
| JP | 2016-213092 | 12/2016 |
| JP | 2016-213093 | 12/2016 |

\* cited by examiner

ROTARY CONNECTOR AND METHOD FOR ASSEMBLING SAME

CROSS-REFERENCE TO RELATED APPLICATIONS

This application is a continuation application of International Application No. PCT/JP2018/016650 filed on Apr. 24, 2018 and designated the U.S., which is based upon and claims priority to Japanese Patent Application No. 2017-159703 filed on Aug. 22, 2017, the entire contents of which are incorporated herein by reference.

BACKGROUND OF THE INVENTION

1. Field of the Invention

Embodiments discussed herein are related to a rotary connector and a method for assembling the same.

2. Description of the Related Art

A rotary connector is used to electrically connect an electric circuit (electric circuit of an airbag or the like) on a steering wheel end of a vehicle, and an electric circuit (Electronic Control Unit (ECU) or the like) on the vehicle end. The rotary connector includes a fixed housing having an outer cylindrical section, a movable housing having an inner cylindrical section and rotatably connected to the fixed housing, and flat cables accommodated in a wound state inside an annular space formed between the outer cylindrical section and the inner cylindrical section. The flat cables are electrically connected to the electric circuits on the steering wheel end and the vehicle end, via external terminals connected to one end of the flat cables. In the rotary connector, the flat cables are wound and tightened, or rewound and loosened, according to turning of the steering wheel, so that electrical connections to the electric circuits on the steering wheel end and the vehicle end are maintained.

An example of a conventional rotary connector is described in Japanese Laid-Open Patent Publication No. 2013-219007, for example.

Conventionally, as a method for electrically connecting the flat cables and the external terminals, there is a known method that spot-welds the end of the flat cables and terminals of a lead block that holds the external terminals.

According to the above-mentioned conventional method, it was necessary to prepare a large-scale spot-welding apparatus to electrically connect the flat cables and the external terminals, and to set the flat cables or the like on the spot-welding apparatus. For this reason, there was a problem in that it takes time and effort to assemble the rotary connector.

SUMMARY OF THE INVENTION

One object of the embodiments is to provide a rotary connector that is easy to assemble.

According to one aspect of the embodiments, a rotary connector includes a fixed housing having an outer cylindrical section; a movable housing, having an inner cylindrical section, and rotatably connected to the fixed housing; a main cable accommodated inside an annular space formed between the outer cylindrical section and the inner cylindrical section; a sub cable having one end connected to one end of the main cable and another end connected to an external terminal; and a lead block having a first block, to which the one end of the main cable and the one end of the sub cable are fixed, and a second block, which is fixed at an arrangement angle crossing an angle at which the first block is arranged, and to which the other end of the sub cable and the external terminal are fixed.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF THE PREFERRED EMBODIMENTS

Figure 1:
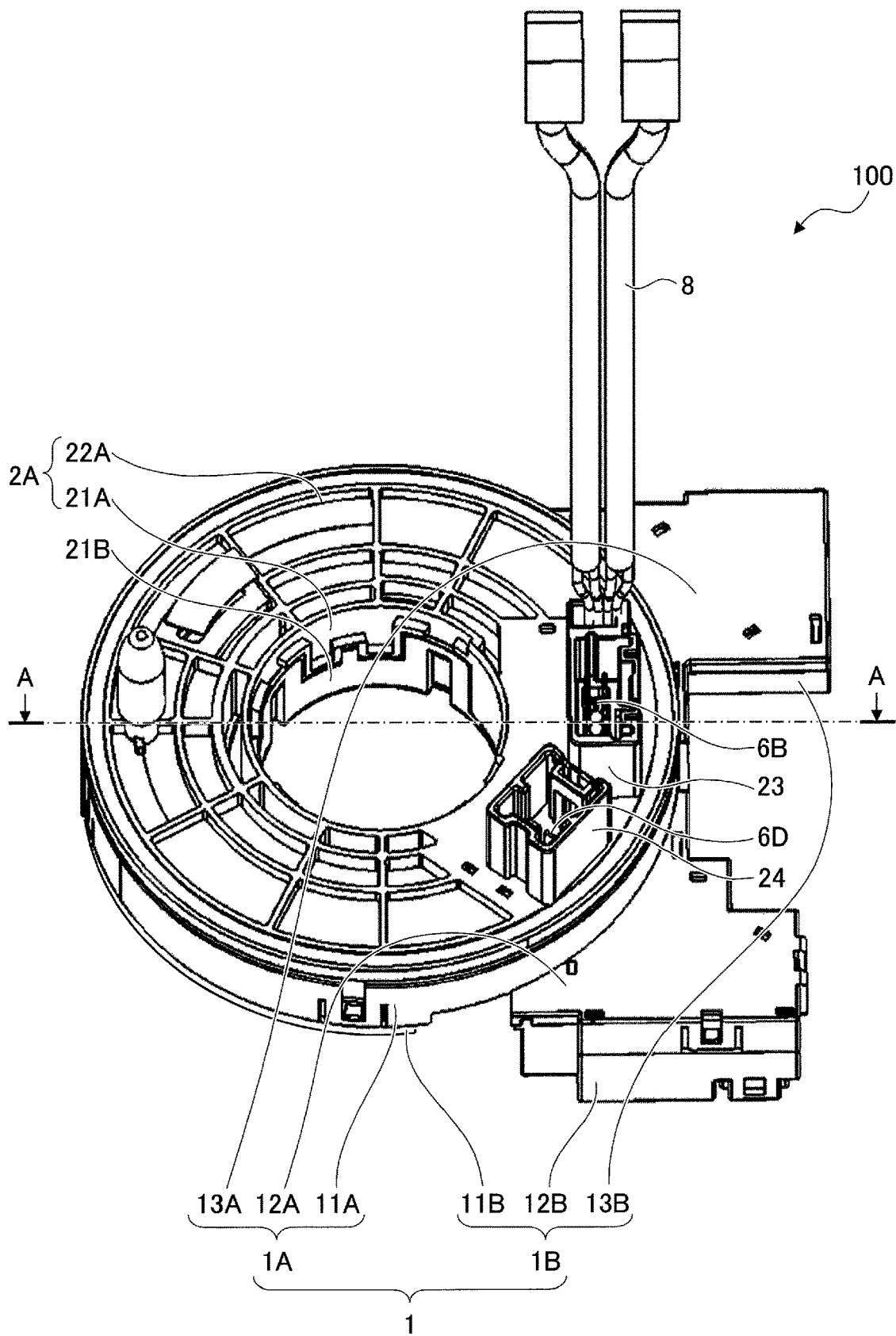
FIG. 1 is a perspective view of an example of a rotary connector viewed from obliquely above.

Preferred embodiments of the present invention will be described in the following, by referring to the accompanying drawings. Constituent elements having substantially the same functions will be designated by the same reference numerals, to omit repeating descriptions thereof.

A rotary connector 100 according to one embodiment will be described, by referring to FIG. 1 through FIG. 11B. The rotary connector 100 according to this embodiment is a connector for electrically connecting an electric circuit (electric circuit of an airbag or the like) on a steering wheel end of a vehicle, and an electric circuit (ECU or the like) on the vehicle end, and is mounted on the vehicle.

Figure 2:
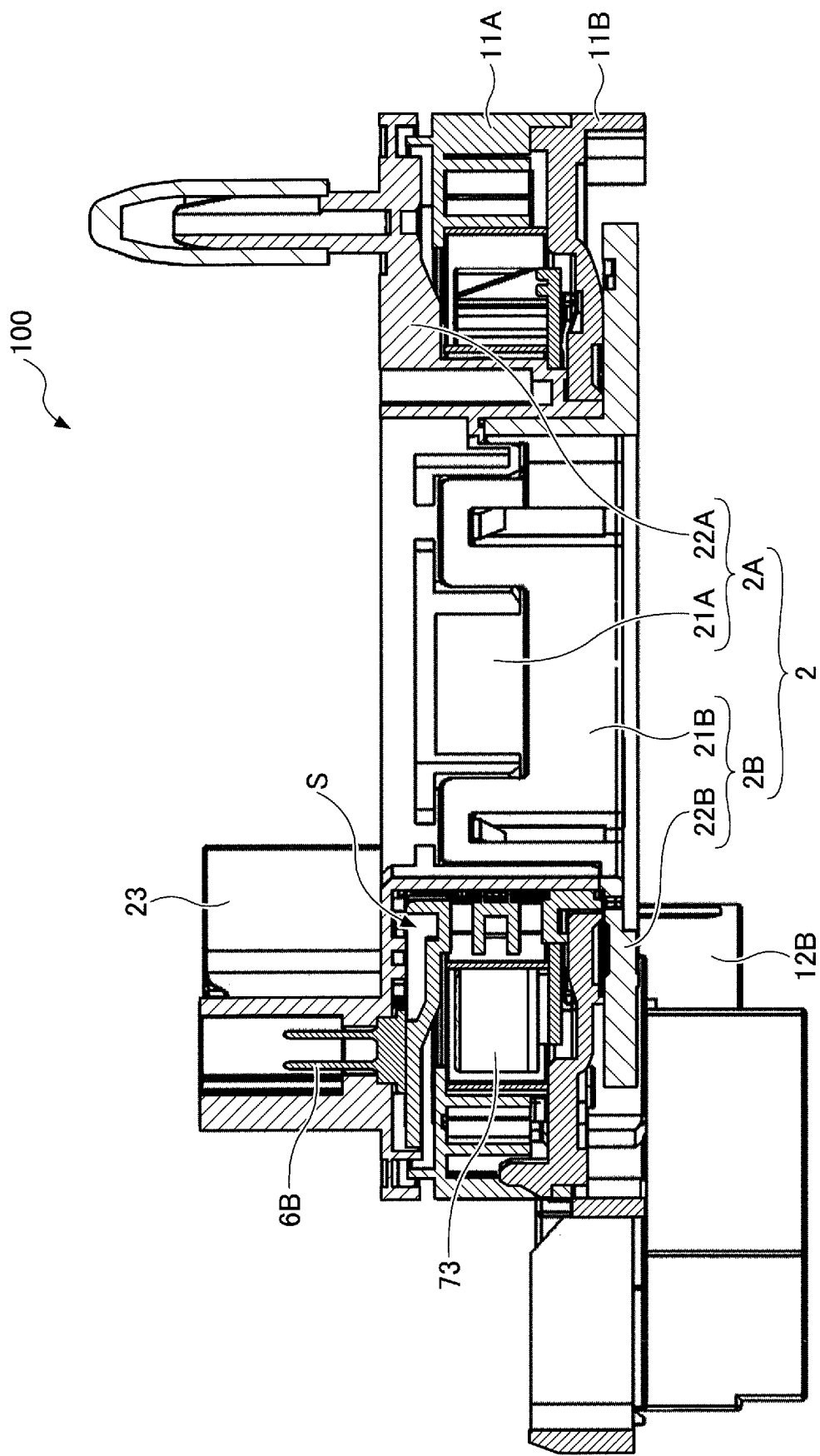
FIG. 2 is a cross sectional view of the rotary connector of FIG. 1 along a line A-A.
Figure 3:
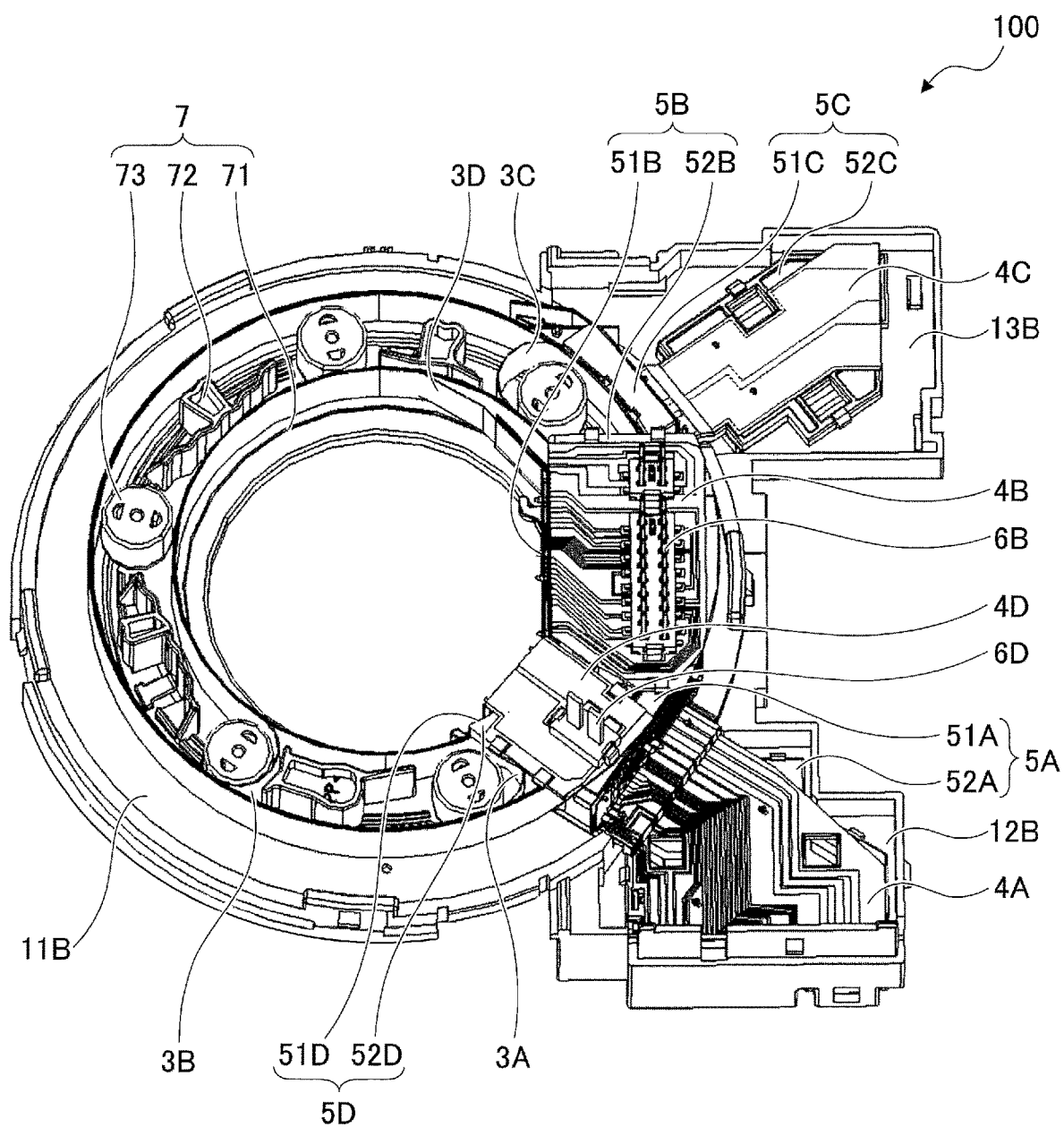
FIG. 3 is a perspective view illustrating an internal structure of the rotary connector of FIG. 1.
Figure 4:
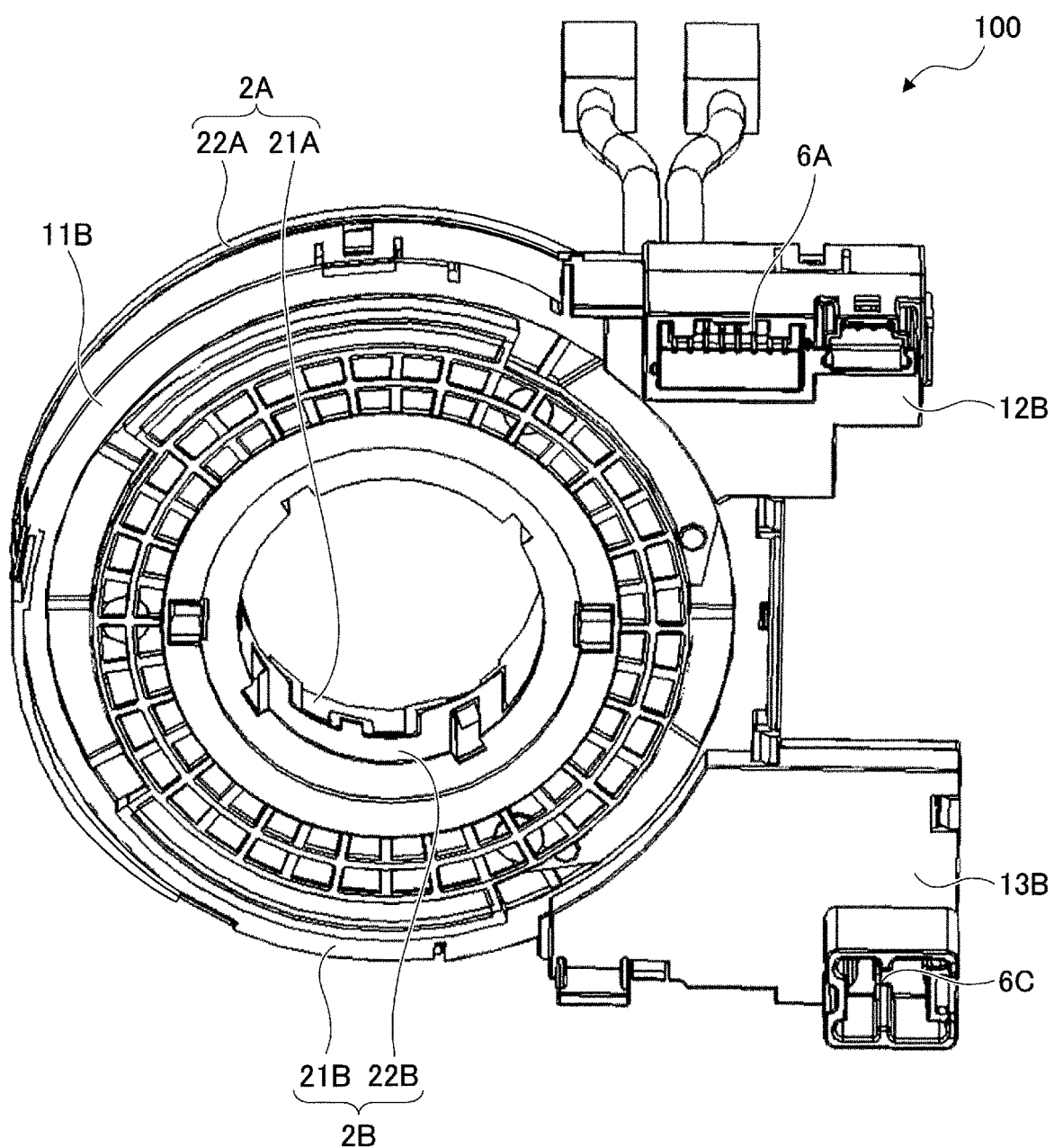
FIG. 4 is a perspective view of the rotary connector of FIG. 1 viewed from obliquely below.

First, a structure of the rotary connector 100 will be described. FIG. 1 is a perspective view of an example of the rotary connector 100 viewed from obliquely above. FIG. 2 is a cross sectional view of the rotary connector 100 of FIG. 1 along a line A-A. FIG. 3 is a perspective view illustrating an internal structure of the rotary connector 100 of FIG. 1. FIG. 4 is a perspective view of the rotary connector 100 of FIG. 1 viewed from obliquely below. In the following, a direction along an axis of rotation of the rotary connector 100 will be referred to as an axial direction, and a direction perpendicular with respect to the axial direction will be referred to as a perpendicular direction.

As illustrated in FIG. 1 through FIG. 4, the rotary connector 100 includes a fixed housing 1, a movable housing 2, main flat cables 3A through 3D that are main cables, sub flat cables 4A through 4D that are sub cables, lead blocks 5A through 5D, external terminals 6A through 6D, and a holder 7. In the following, the main flat cables 3A through 3D will be referred to as main flat cables 3 when not to be distinguished from one another. In addition, the sub flat cables 4A through 4D will be referred to as sub flat cables 4 when not to be distinguished from one another. Moreover, the lead blocks 5A through 5D will be referred to as lead blocks 5 when not to be distinguished from one another. Further, the external terminals 6A through 6D will be referred to as external terminals 6 when not to be distinguished from one another.

The fixed housing 1 is fixed to a steering column (illustration omitted) of the vehicle. The fixed housing 1 includes an upper stator 1A and a lower stator 1B, made of a synthetic resin. The upper stator 1A and the lower stator 1B are snap-fit and connected. The upper stator 1A and the lower stator 1B, which are connected, form the fixed housing 1.

The upper stator 1A includes an outer cylindrical section 11A that has a cylindrical shape extending in the axial direction, and upper holding sections 12A and 13A extending in the perpendicular direction from a lower end of the outer cylindrical section 11A. The lower stator 1B includes a bottom plate section 11B that has a ring shape and is perpendicular to the axial direction, and lower holding sections 12B and 13B extending toward an outer side from an outer peripheral edge of the bottom plate 11B. The bottom holding sections 12B and 13B have openings for exposing the external terminals 6A and 6C, respectively. The outer cylindrical section 11A and the bottom plate section 11B are formed so that the lower end of the outer cylindrical section 11A and the outer peripheral edge of the bottom plate section 11B correspond to each other. The upper holding section 12A and the lower holding section 12B are provided at positions corresponding to each other. The upper holding section 13A and the lower holding section 13B are provided at positions corresponding to each other.

When the upper stator 1A and the lower stator 1B are snap-fit and connected, the upper holding section 12A and the lower holding section 12B become connected, and the upper holding section 13A and the lower holding section 13B become connected. The holding section 12 is formed by the upper holding section 12A and the lower holding section 12B that are connected. The holding section 12 is a section that holds the lead block 5A and the external terminal 6A, to hold the external terminal 6A in a state where the external terminal 6A projects from the opening, and to accommodate the lead block 5A inside the holding section 12. In addition, the holding section 13 is formed by the upper holding section 13A and the lower holding section 13B that are connected. The holding section 13 is a section that holds the lead block 5C and the external terminal 6C, to hold the external terminal 6C in a state where the external terminal 6C projects from the opening, and to accommodate the lead block 5C inside the holding section 13.

The movable housing 2 is connected to the steering wheel of the vehicle, so that the movable housing 2 is rotatable together with the steering wheel. In addition, the movable housing 2 is connected to the fixed housing 1, so that the movable housing 2 is rotatable with respect to the fixed housing 1. The movable housing 2 includes an upper rotor 2A and a lower rotor 2B, made of a synthetic resin. The upper rotor 2A and the lower rotor 2B are snap-fit and connected. The movable housing 2 is formed by the upper rotor 2A and the lower rotor 2B that are connected.

The upper rotor 2A includes an inner cylindrical section 21A that has a cylindrical shape extending in the axial direction, and a top plate section 22A that has a ring shape extending in the perpendicular direction from an upper end of the inner cylindrical section 21A. Holding sections 23 and 24 that project upward are provided on an upper surface of the top plate section 22A. The holding section 23 is a section that holds the external terminal 6B, and has an opening. The holding section 23 holds the external terminal 6B in a state where the external terminal 6B projects from the opening. The holding section 24 is a section that holds the external terminal 6D, and has an opening. The holding section 24 holds the external terminal 6D in a state where the external terminal 6D projects from the opening.

The lower rotor 2B includes an inner cylindrical section 21B that has a cylindrical shape extending in the axial direction, and a bottom plate section 22B that has a ring shape extending in the perpendicular direction from a lower end of the inner cylindrical section 21B. Inner diameters of the inner cylindrical sections 21A and 21B are designed to have a size that permits a steering shaft (illustration omitted) to pass through, and the inner cylindrical sections 21A and 21B are snap-fit and connected. The top plate section 22A is formed so that an outer peripheral edge thereof and the upper end of the outer cylindrical section 11A correspond to each other. The inner cylindrical section 21A is connected to the inner cylindrical section 21B from above the fixed housing 1, in a state where the inner cylindrical section 21B is inserted into an inner side of the bottom plate section 11B, to rotatably connect the movable housing 2 with respect to the fixed housing 1. When the fixed housing 1 and the movable housing 2 are connected, a ring-shaped space S is formed between the fixed housing 1 and the movable housing 2, as illustrated in FIG. 2.

The main flat cable 3, that is the main cable, is a long flexible cable formed by a Flexible Printed Circuit (FPC). The main flat cable 3 electrically connects one end of one sub flat cable 4 and one end of another sub flat cable 4. As illustrated in FIG. 3, the main flat cable 3 is accommodated inside the ring-shaped space S in a wound state. A winding direction of the main flat cable 3 is reversed halfway, so that the main flat cable 3 may be wound and rewound according to the turning of the steering wheel.

The main flat cables 3A and 3B are cables that electrically connect electric circuits of an airbag, a horn, and a steering switch, and an electric circuit on the vehicle end. Since the main flat cables 3A and 3B are cables that are used to transmit relatively small power, the main flat cables 3A and 3B have a large number of thin conductor wires that are electrically connected from one end to the other end and extend for the entire width along a longitudinal direction. In addition, the conductor wires are covered from both sides by an insulating film such as polyimide or the like that extends for the entire width along the longitudinal direction, and an opening is provided in the insulating film at the one end and the other end of the main flat cables 3A and 3B to provide a connecting section that exposes the conductor wires through the opening at the one end and the other end of the main flat cables 3A and 3B, respectively. The connecting section provided at the one end of each of the main flat cables 3A and 3B is electrically connected to the one end of the sub flat cable 4A, and the connecting section provided at the other end of each of the main flat cables 3A and 3B is electrically connected to the one end of the sub flat cable 4B.

The main flat cables 3C and 3D are cables that electrically connect a steering heater, and an electric circuit on the vehicle end. Since the main flat cables 3C and 3D are cables that are used to transmit relatively large power, the main flat cables 3C and 3D have a small number of thick conductor wires that are electrically connected from one end to the other end and extend for the entire width along a longitudinal direction. In addition, the conductor wires are covered from both sides by an insulating film such as polyimide or the like that extends for the entire width along the longitudinal direction, and an opening is provided in the insulating film at the one end and the other end of the main flat cables 3C and 3D to provide a connecting section that exposes the conductor wires through the opening at the one end and the other end of the main flat cables 3C and 3D, respectively. The connecting section provided at the one end of each of the main flat cables 3C and 3D is electrically connected to the one end of the sub flat cable 4C, and the connecting section provided at the other end of each of the main flat cables 3C and 3D is electrically connected to the one end of the sub flat cable 4D.

The sub flat cable 4, that is the sub cable, is a flexible cable formed by a FPC having a structure similar to that of the main flat cable 3, but shorter than the main flat cable 3, and is provided with a connecting section that exposes conductor wires at each of the one end and the other end of the sub flat cable 4. The connecting section at the one end of the sub flat cable 4 is electrically connected to the one end of the main flat cable 3, and the connecting section at the other end of the sub flat cable 4 is electrically connected to the external terminal 6, so that the main flat cable 3 and the external terminal 6 are electrically connected via the sub flat cable 4. As illustrated in FIG. 3, the sub flat cable 4 is fixed to the lead block 5.

The sub flat cable 4A is fixed to the lead block 5A, and the one end of the sub flat cable 4A is electrically connected to the one end of each of the main flat cables 3A and 3B, and the other end of the sub flat cable 4A is electrically connected to the external terminal 6A. The one end of the sub flat cable 4A and the one end of each of the main flat cables 3A and 3B are electrically connected by solder via the respective connecting sections. In addition, the connecting section at the other end of the sub flat cable 4A is electrically connected to the external terminal 6A by solder.

The sub flat cable 4B is fixed to the lead block 5B, and the one end of the sub flat cable 4B is electrically connected to the other end of each of the main flat cables 3A and 3B, and the other end of the sub flat cable 4B is electrically connected to the external terminal 6B. The one end of the sub flat cable 4B and the other end of each of the main flat cables 3A and 3B are electrically connected by solder via the respective connecting sections. In addition, the connecting section at the other end of the sub flat cable 4B is electrically connected to the external terminal 6B by solder.

The sub flat cable 4C is fixed to the lead block 5C, and the one end of the sub flat cable 4C is electrically connected to the one end of each of the main flat cables 3C and 3D, and the other end of the sub flat cable 4C is electrically connected to the external terminal 6C. The one end of the sub flat cable 4C and the one end of each of the main flat cables 3C and 3D are electrically connected by solder via the respective connecting sections. In addition, the connecting section at the other end of the sub flat cable 4C is electrically connected to the external terminal 6C by solder.

The sub flat cable 4D is fixed to the lead block 5D, and the one end of the sub flat cable 4D is electrically connected to the other end of each of the main flat cables 3C and 3D, and the other end of the sub flat cable 4D is electrically connected to the external terminal 6D. The one end of the sub flat cable 4D and the other end of each of the main flat cables 3C and 3D are electrically connected by solder via the respective connecting sections. In addition, the connecting section at the other end of the sub flat cable 4D is electrically connected to the external terminal 6D by solder.

The lead block 5 is a resin member for fixing the end section of the main flat cable 3, the sub flat cable 4, and the external terminal 6 in a mutually electrically connected state. The lead block 5 includes a section for fixing the main flat cable 3, and a section for fixing the external terminal 6. Because the main flat cable 3 is parallel to the axial direction, the section for fixing the main flat cable 3 is arranged parallel to the axial direction. In addition, because the external terminal 6 is arranged to project in the axial direction, the section for fixing the external terminal 6 is arranged approximately perpendicularly to the axial direction. An approximately perpendicular state includes a predetermined angular range (for example, 80 degrees to 100 degrees) with reference to the perpendicular state. Accordingly, the lead block 5 has a cross sectional shape that is approximately L-shaped.

The lead block 5A is a lead block for fixing the one end of each of the main flat cables 3A and 3B, the sub flat cable 4A, and the external terminal 6A, and is accommodated in the holding section 12. The lead block 5A includes a first block 51A, and a second block 52A.

The first block 51A is a section for fixing the main flat cable 3, that is arranged parallel to the axial direction, and has one face to which the one end of each of the main flat cables 3A and 3B and the one end of the sub flat cable 4A are fixed. The face of the first block 51A to which the main flat cables 3A and 3B are fixed, will be referred to as the surface of the first block 51A.

The second block 52A is a section for fixing the external terminal 6, that is arranged approximately perpendicularly to the axial direction, and has one face (lower surface in FIG. 3) to which the other end of the sub flat cable 4A and the external terminal 6A are fixed. The second block 52A is a separate body from the first block 51A, and is fixed to extend toward the surface of the first block 51A, in a state inclined approximately perpendicularly at an arrangement angle crossing an angle at which the first block 51A is arranged.

The lead block 5B is a lead block for fixing the other end of each of the main flat cables 3A and 3B, the sub flat cable 4B, and the external terminal 6B. The sub flat cable 4B that is fixed to the lead block 5B is held by the holding section 23. The lead block 5B includes a first section 51B, and a second section 52B.

The first section 51B is a section for fixing the main flat cable 3, that is arranged parallel to the axial direction, and has one face to which the other end of each of the main flat cables 3A and 3B and the one end of the sub flat cable 4B are fixed. The face of the first section 51B to which the main flat cables 3A and 3B are fixed, will be referred to as the surface of the first section 51B.

The second section 52B is a section for fixing the external terminal 6, that is arranged approximately perpendicularly to the axial direction, and has one face (upper surface in FIG. 3) to which the other end of the sub flat cable 4B and the external terminal 6B are fixed. The second section 52B is formed integrally with the first section 51B, and extends toward a rear surface of the first section 51B, in a state inclined approximately perpendicularly with respect to the first section 51B.

The lead block 5C is a lead block for fixing the one end of each of the main flat cables 3C and 3D, the sub flat cable 4C, and the external terminal 6C, and is accommodated in the holding section 13. The lead block 5C includes a first block 51C, and a second block 52C.

The first block 51C is a section for fixing the main flat cable 3, that is arranged parallel to the axial direction, and has one face to which the one end of each of the main flat cables 3C and 3D and the one end of the sub flat cable 4C are fixed. The face of the first block 51C to which the main flat cables 3C and 3D are fixed, will be referred to as the surface of the first block 51C.

The second block 52C is a section for fixing the external terminal 6, that is arranged approximately perpendicularly to the axial direction, and has one face (lower surface in FIG. 3) to which the other end of the sub flat cable 4C and the external terminal 6C are fixed. The second block 52C is a separate body from the first block 51C, and is fixed to extend toward the surface of the first block 51C, in a state inclined approximately perpendicularly at an arrangement angle crossing an angle at which the first block 51C is arranged.

The lead block 5D is a lead block for fixing the other end of each of the main flat cables 3C and 3D, the sub flat cable 4D, and the external terminal 6D. The sub flat cable 4D that is fixed to the lead block 5D is held by the holding section 24. The lead block 5D includes a first section 51D, and a second section 52D.

The first section 51D is a section for fixing the main flat cable 3, that is arranged parallel to the axial direction, and has one face to which the other end of each of the main flat cables 3C and 3D and the one end of the sub flat cable 4D are fixed. The face of the first section 51D to which the main flat cables 3C and 3D are fixed, will be referred to as the surface of the first section 51D.

The second section 52D is a section for fixing the external terminal 6, that is arranged approximately perpendicularly to the axial direction, and has one face (upper surface in FIG. 3) to which the other end of the sub flat cable 4D and the external terminal 6D are fixed. The second section 52D is formed integrally with the first section 51D, and extends toward a rear surface of the first section 51D, in a state inclined approximately perpendicularly with respect to the first section 51D.

The external terminals 6 are terminals for electrically connecting the rotary connector 100, and the electric circuits on the vehicle end and the steering wheel end. The external terminals 6 are fixed on the lead blocks 5 so as to project in the axial direction from the rotary connector 100, and are held by the holding sections 12, 13, 23, and 24.

The external terminal 6A is fixed to the lower surface of the second block 52A, and is held in a state projecting downward from the opening in the holding section 12. The external terminal 6A is electrically connected to the other end of the sub flat cable 4A.

The external terminal 6B is fixed to the upper surface of the second section 52B, and is held in a state projecting upward from the opening in the holding section 23. The external terminal 6B is electrically connected to the other end of the sub flat cable 4B. In the example illustrated in FIG. 1, a portion of the external terminal 6B is electrically connected to the electric circuits on the steering wheel end, via a wire harness 8.

The external terminal 6C is fixed to the lower surface of the second block 52C, and is held in a state projecting downward from the opening in the holding section 13. The external terminal 6C is electrically connected to the other end of the sub flat cable 4C.

The external terminal 6D is fixed to the upper surface of the second section 52D, and is held in a state projecting upward from the opening in the holding section 24. The external terminal 6D is electrically connected to the other end of the sub flat cable 4D.

The holder 7 is a resin member that is rotatable inside the ring-shaped space S, and holds the main flat cable 3 in a wound state. The holder 7 includes a ring-shaped flat plate section 71 that is slidably arranged on the bottom plate section 11B, a plurality of guide walls 72 that extend upward from the flat plate section 71, and a plurality of rollers 73 that are rotatably supported on a plurality of shafts respectively extending upwards from the flat plate section 71. The main flat cable 3 is reversed of its winding direction by being wound around the rollers 73.

As described above, the electric circuits (electric circuits of the airbag or the like) on the steering wheel end and the electric circuits on the vehicle end are electrically connected by the external terminal 6A, the sub flat cable 5A, the main flat cables 3A and 3B, the sub flat cable 4B, and the external terminal 6B. The external terminal 6A, the sub flat cable 4A, and one end of the each of the main flat cables 3A and 3B, are fixed to the lead block 5A, while the other end of each of the main flat cables 3A and 3B, the sub flat cable 4B, and the external terminal 6B are fixed to the lead block 5B. When the steering wheel turns, the main flat cables 3A and 3B are wound and tightened, or rewound and loosened, according to turning of the steering wheel, but both ends of the main flat cables 3A and 3B that are fixed to the lead blocks 5A and 5B, respectively, do not move with respect to the sub flat cable 4 and the external terminal 6. Accordingly, even when the steering wheel turns, the above-mentioned electrical connections to the electric circuits on the steering wheel end and the vehicle end are maintained.

In addition, the electric circuits (electric circuits of the steering wheel heater or the like) on the steering wheel end and the electric circuits on the vehicle end are electrically connected by the external terminal 6C, the sub flat cable 4C, the main flat cables 3C and 3D, the sub flat cable 4D, and the external terminal 6D. The external terminal 6C, the sub flat cable 4C, and one end of the each of the main flat cables 3C and 3D, are fixed to the lead block 5C, while the other end of each of the main flat cables 3C and 3D, the sub flat cable 4D, and the external terminal 6D are fixed to the lead block 5D. When the steering wheel turns, the main flat cables 3C and 3D are wound and tightened, or rewound and loosened, according to turning of the steering wheel, but both ends of the main flat cables 3C and 3D that are fixed to the lead blocks 5C and 5D, respectively, do not move with respect to the sub flat cable 4 and the external terminal 6. Accordingly, even when the steering wheel turns, the above-mentioned electrical connections to the electric circuits on the steering wheel end and the vehicle end are maintained.

Next, a method for assembling the rotary connector 100 will be described. In the following, a method for assembling each of the lead blocks 5A and 5B will be described.

FIG. 5A through FIG. 5E are side views illustrating each of steps of the method for assembling the lead block 5B. The lead block 5D may be assembled by a method similar to the method for assembling the lead block 5B.

Figure 5A:
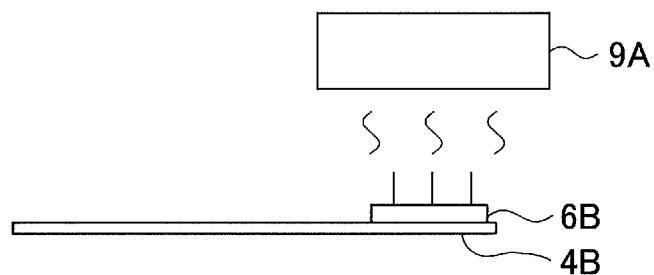
FIG. 5A is a side view illustrating each of steps of a method for assembling a lead block.

First, as illustrated in FIG. 5A, the external terminal 6B is electrically connected to a connecting section on the surface of the other end of the sub flat cable 4B by reflow soldering. More particularly, the external terminal 6B is arranged at a predetermined position on the surface of the other end of the sub flat cable 4B, and a periphery of the external terminal 6B is heated by a reflow heater 9A. A solder paste is coated in advance on the connecting section of the sub flat cable 4B to be electrically connected to the external terminal 6B. Hence, the external terminal 6B and the sub flat cable 4B are electrically connected by the solder.

Figure 5B:
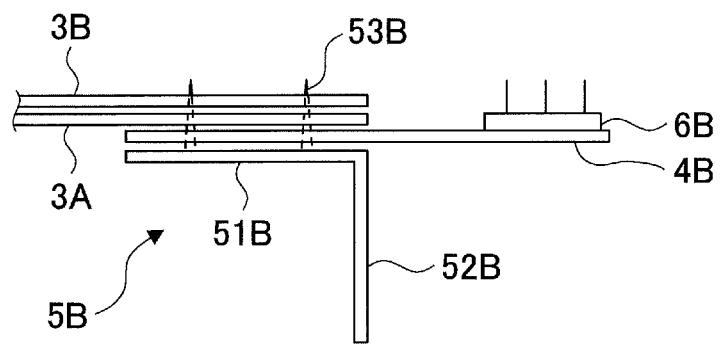
FIG. 5B is a side view illustrating each of steps of the method for assembling the lead block.

Next, as illustrated in FIG. 5B, the other end of each of the main flat cables 3A and 3B, and the one end of the sub flat cable 4B are arranged to overlap each other at a predetermined position on the surface of the first section 51B of the lead block 5B. One or a plurality of projections 53B are provided on the surface of the first section 51B. In addition, one or a plurality of holes corresponding to the one or plurality of projections 53B are provided at the other end of each of the main flat cables 3A and 3B and at the one end of the sub flat cable 4B. The main flat cables 3A and 3B, and the sub flat cable 4B are arranged so that the one or plurality of projections 53B are inserted through the one or plurality of holes provided at the end sections of the main flat cables 3A and 3B and the sub flat cable 4B. The main flat cables 3A and 3B, and the sub flat cable 4B may be overlapped in an arbitrary order.

Figure 5C:
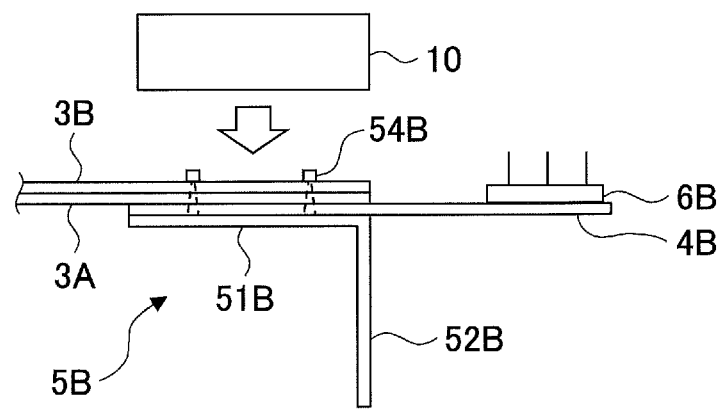
FIG. 5C is a side view illustrating each of steps of the method for assembling the lead block.

Next, as illustrated in FIG. 5C, the plurality of projections 53B are simultaneously crushed from immediately above using a caulking machine 10, to form caulked sections 54B. The caulked sections 54B fix the connecting sections at the other end of each of the main flat cables 3A and 3B, and the connecting section at the one end of the sub flat cable 4B, to a predetermined position on the surface of the first section 51B in a state where no gap is formed among the connecting sections.

Figure 5D:
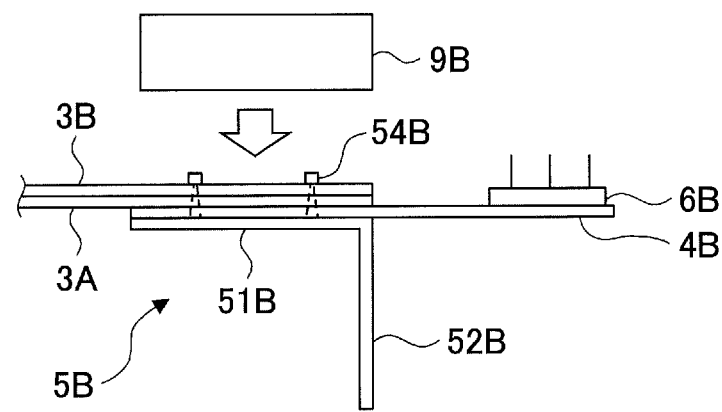
FIG. 5D is a side view illustrating each of steps of the method for assembling the lead block.

Next, as illustrated in FIG. 5D, the connecting sections at the other end of each of the main flat cables 3A and 3B, and the connecting section at the one end of the sub flat cable 4B, are soldered. More particularly, the connecting sections are heated while being pressed from immediately above, by a soldering heater 9B. The connecting sections at the other end of each of the main flat cables 3A and 3B, and the connecting section at the one end of the sub flat cable 4B, are solder-plated in advance. Hence, the connecting sections at the other end of each of the main flat cables 3A and 3B, and the connecting section at the one end of the sub flat cable 4B, are electrically connected by the solder.

Figure 5E:
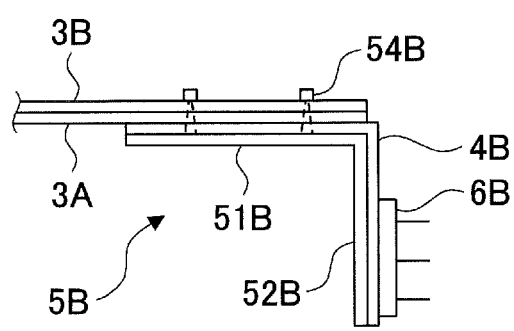
FIG. 5E is a side view illustrating each of steps of the method for assembling the lead block.

Thereafter, as illustrated in FIG. 5E, the external terminal 6B and the other end of the sub flat cable 4B are connected to the second section 52B of the lead block 5B by snap-fit connection or the like. Hence, the other end of each of the main flat cables 3A and 3B, the sub flat cable 4B, and the external terminal 6B are fixed to the lead block 5B.

As illustrated in FIG. 5E, in the lead block 5B, the second section 52B (section fixing the external terminal 6) extends to a rear surface end of the first section 51B (section fixing the main flat cable 3). For this reason, when performing the caulking and the soldering, the second section 52B does not interfere with the caulking machine 10 and the soldering heater 9B from approaching the surface of the first section 51B from immediately above. Similarly, this holds true also for the lead block 5D.

On the other hand, in the case of the lead block 5A in which the section for fixing the external terminal 6 extends to a front surface end of the section that fixes the main flat cable 3, the section for fixing the external terminal 6 interferes with the caulking machine 10 and the soldering heater 9B from approaching the surface of the section for fixing the main flat cable 3 from immediately above. As a result, particularly the caulking and the soldering using an automatic machine that moves up and down become difficult. Similarly, this holds true also for the lead block 5C.

Accordingly, in this embodiment, the lead blocks 5A and 5C are formed by two components, namely, the section (first blocks 51A and 51C) for fixing the main flat cable 3, and the section (second blocks 52A and 52C) for fixing the external terminal 6, respectively. In addition, by assembling the two components after the caulking and the soldering, each machine can approach a large area on the surface from immediately above, to enable the caulking and the soldering to be easily performed.

Figure 6:
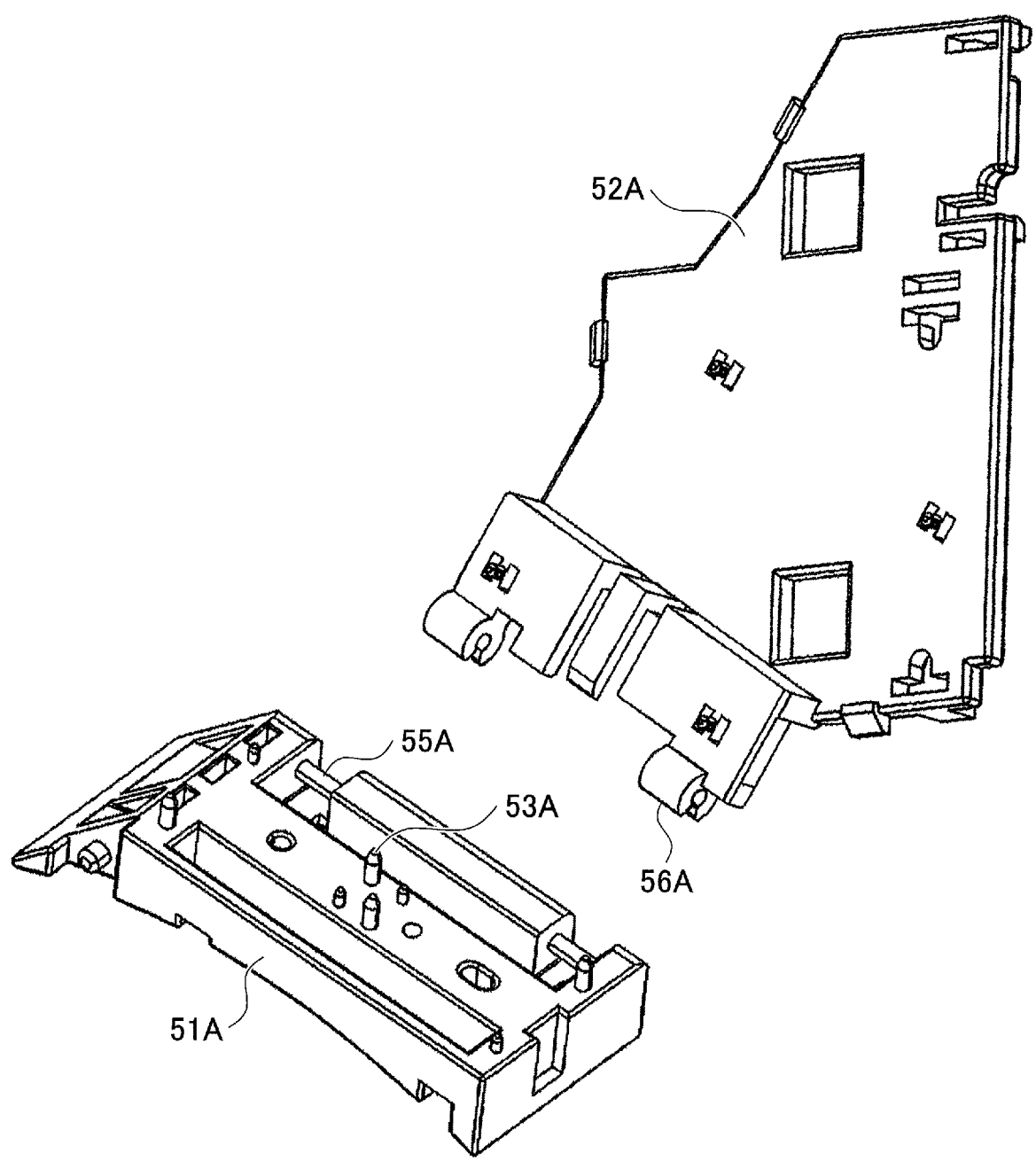
FIG. 6 is a disassembled perspective view illustrating an example of the lead block.

Next, FIG. 6 is a disassembled perspective view illustrating an example of the lead block 5A. In the example illustrated in FIG. 6, one of the first block 51A and the second block 52A, namely, the first block 51A, is provided with a plurality of projections 53A on a surface thereof, and a shaft section 55A on an end section thereof. In addition, the other of the first block 51A and the second block 52A, namely, the second block 52A, is provided with a hook 56A that hooks onto the shaft section 55A, on an end section thereof. By hooking the hook 56A onto the shaft section 55A, the second block 52A becomes rotatable within a predetermined angular range around an axis of the shaft section 55A. Alternatively, the shaft section 55A may be provided on the second block 52A, and the hook 56A may be provided on the first block 51A. In addition, the lead block 5C may be formed to have a structure similar to that illustrated in FIG. 6.

FIG. 7A through FIG. 7G are side views illustrating each of steps of a method for assembling the lead block 5A illustrated in FIG. 6. The lead block 5C may be assembled by a method similar to the method for assembling the lead block 5A.

Figure 7A:
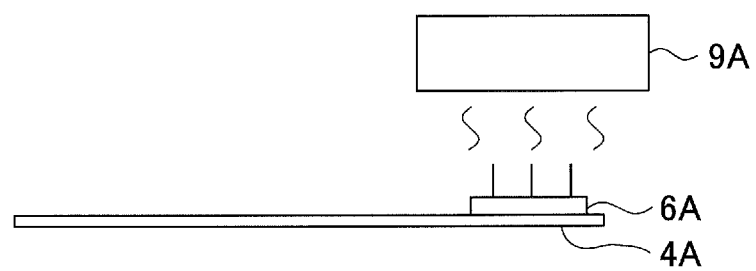
FIG. 7A is a side view illustrating each of steps of the method for assembling the lead block.

First, as illustrated in FIG. 7A, the external terminal 6A is electrically connected to a connecting section on the surface of the other end of the sub flat cable 4A by reflow soldering. More particularly, the external terminal 6A is arranged at a predetermined position on the surface of the other end of the sub flat cable 4A, and a periphery of the external terminal 6A is heated by the reflow heater 9A. A solder paste is coated in advance on the connecting section of the sub flat cable 4A to be electrically connected to the external terminal 6A. Hence, the external terminal 6A and the sub flat cable 4A are electrically connected by the solder.

Figure 7B:
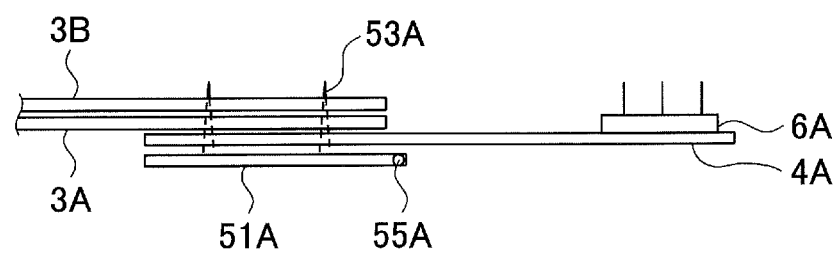
FIG. 7B is a side view illustrating each of steps of the method for assembling the lead block.

Next, as illustrated in FIG. 7B, the one end of each of the main flat cables 3A and 3B, and the one end of the sub flat cable 4A are arranged to overlap each other at a predetermined position on the surface of the first block 51A of the lead block 5A. The plurality of projections 53A are provided on the surface of the first block 51A, as described above. In addition, the plurality of holes corresponding to the plurality of projections 53A are provided at the one end of each of the main flat cables 3A and 3B and at the one end of the sub flat cable 4A. The main flat cables 3A and 3B, and the sub flat cable 4A are arranged so that the plurality of projections 53A are inserted through the holes provided at the end sections of the main flat cables 3A and 3B and the sub flat cable 4A. The main flat cables 3A and 3B, and the sub flat cable 4A may be overlapped in an arbitrary order.

Figure 7C:
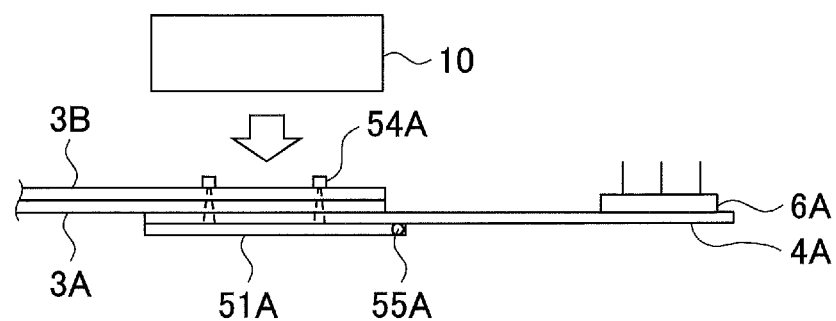
FIG. 7C is a side view illustrating each of steps of the method for assembling the lead block.

Next, as illustrated in FIG. 7C, the plurality of projections 53A are simultaneously crushed from immediately above using the caulking machine 10, to form caulked sections 54A. The caulked sections 54A fix the connecting sections at the one end of each of the main flat cables 3A and 3B, and the connecting section at the one end of the sub flat cable 4A, to a predetermined position on the surface of the first block 51A in a state where no gap is formed among the connecting sections. At this point in time, the second block 52A is not connected to the first block 51A, and thus, the second block 52A does not interfere with the caulking machine 10, and the caulking machine 10 can simultaneously crush the plurality of projections 53A by approaching the entire surface of the first block 51A from immediately above.

Figure 7D:
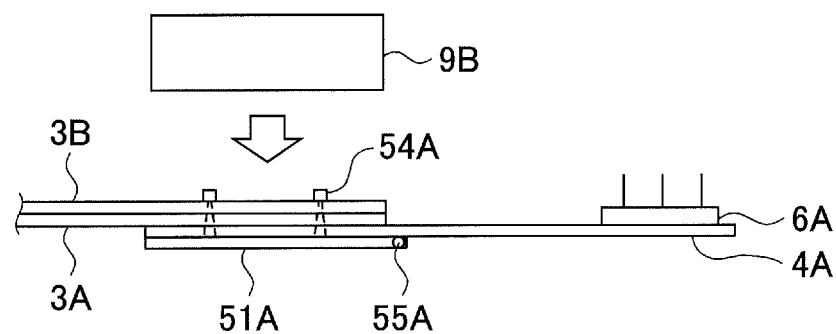
FIG. 7D is a side view illustrating each of steps of the method for assembling the lead block.

Next, as illustrated in FIG. 7D, the connecting sections at the one end of each of the main flat cables 3A and 3B, and the connecting section at the one end of the sub flat cable 4A, are soldered. More particularly, the connecting sections are heated while being pressed from immediately above, by the soldering heater 9B. The connecting sections at the one end of each of the main flat cables 3A and 3B, and the connecting section at the one end of the sub flat cable 4A, are solder-plated in advance. Hence, the connecting sections at the one end of each of the main flat cables 3A and 3B, and the connecting section at the one end of the sub flat cable 4B, are electrically connected by the solder. At this point in time, the second block 52A is not connected to the first block 51A, and thus, the second block 52A does not interfere with the soldering heater 9B, and the soldering heater 9B can simultaneously solder a large area by approaching the entire surface of the first block 51A from immediately above.

Figure 7E:
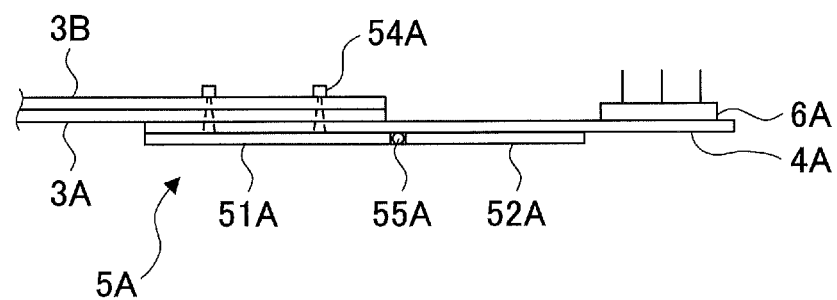
FIG. 7E is a side view illustrating each of steps of the method for assembling the lead block.

Then, as illustrated in FIG. 7E, the hook 56A of the second block 52A is hooked onto the shaft section 55A of the first block 51A, to connect the first block 51A and the second block 52A.

Figure 7F:
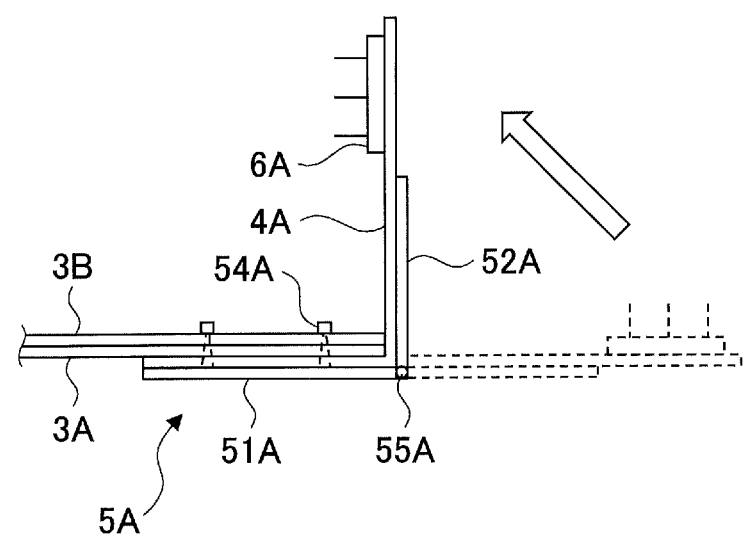
FIG. 7F is a side view illustrating each of steps of the method for assembling the lead block.

Next, as illustrated in FIG. 7F, the second block 52A is rotated around an axis of the shaft section 55A, to raise the second block 52A to an approximately perpendicular state with respect to the first block 51A.

Figure 7G:
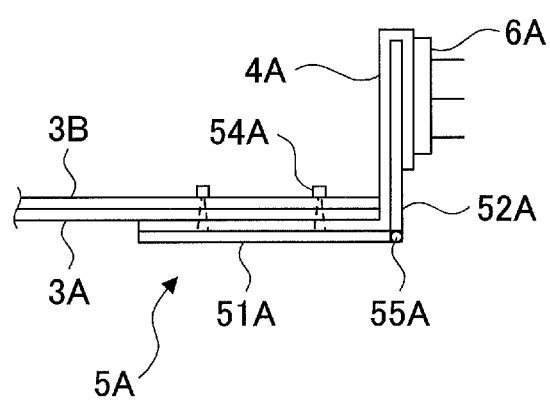
FIG. 7G is a side view illustrating each of steps of the method for assembling the lead block.

Thereafter, as illustrated in FIG. 7G, the external terminal 6A and the other end of the sub flat cable 4A are connected to one surface of the second block 52A by snap-fit connection or the like. Hence, the one end of each of the main flat cables 3A and 3B, the sub flat cable 4A, and the external terminal 6A are fixed to the lead block 5A.

Figure 8A:
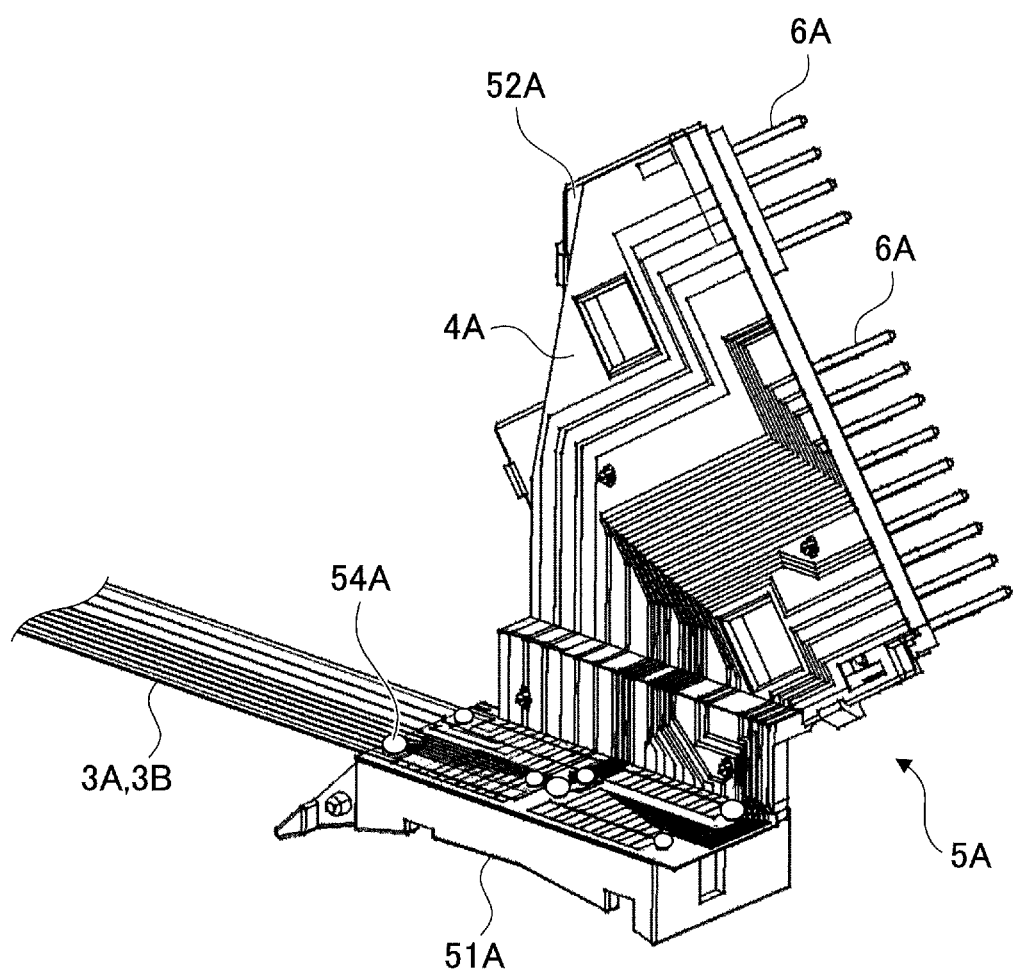
FIG. 8A is a perspective view illustrating the lead block in a state where assembling is completed.
Figure 8B:
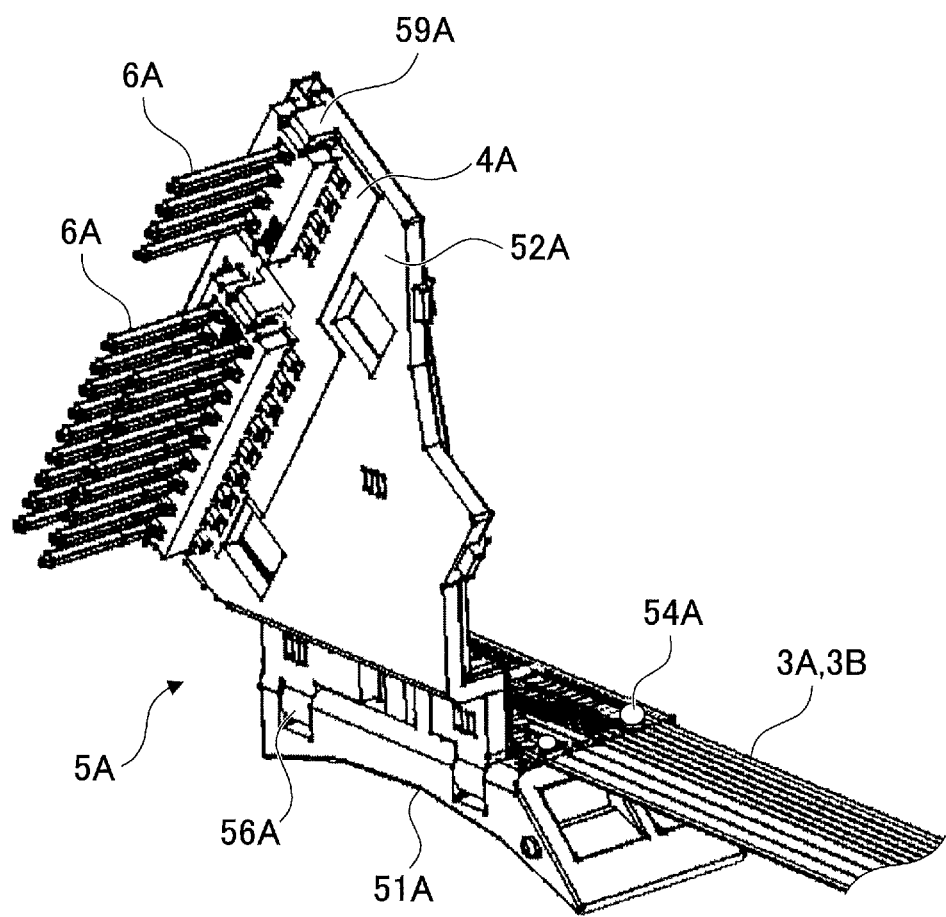
FIG. 8B is a perspective view illustrating the lead block in the state where the assembling is completed.

FIG. 8A and FIG. 8B are perspective views illustrating the lead block 5A in a state where the assembling is completed. FIG. 8A is the perspective view viewed from the front surface end, and FIG. 8B is the perspective view viewed from the rear surface end. The lead block 5A illustrated in FIG. 8A and FIG. 8B corresponds to the lead block 5A illustrated in FIG. 7G.

In the example illustrated in FIG. 8A and FIG. 8B, the connecting section at the one end of each of the main flat cables 3A and 3B, and the connecting section at the one end of the sub flat cable 4A, in the soldered state, are fixed to the surface of the first block 51A by the caulked sections 54A. The sub flat cable 4A is arranged from the surface of the first block 51A along the surface of the lead block 5A, and the other end of the sub flat cable 4A is folded back to the rear surface of the second block 52A. The connecting section at the other end of the sub flat cable 4A is electrically connected by solder to the external terminal 6A that is fixed to the rear surface of the second block 52A by a snap 59A. According to the assembling method of FIG. 7A through FIG. 7G, it is possible to assemble the lead block 5A as illustrated in FIG. 5E, using the reflow heater 9A, the soldering heater 9B, and the caulking machine 10.

When the second block 52A is raised to the approximately perpendicular state with respect to the first block 51A, the second block 52A may be fixed with respect to the first block 51A by snap-fit connection or the like. In addition, the second block 52A may be fixed in the state approximately perpendicular with respect to the first block 51A, by the sub flat cable 4A that is fixed to the lead block 5A.

Figure 9:
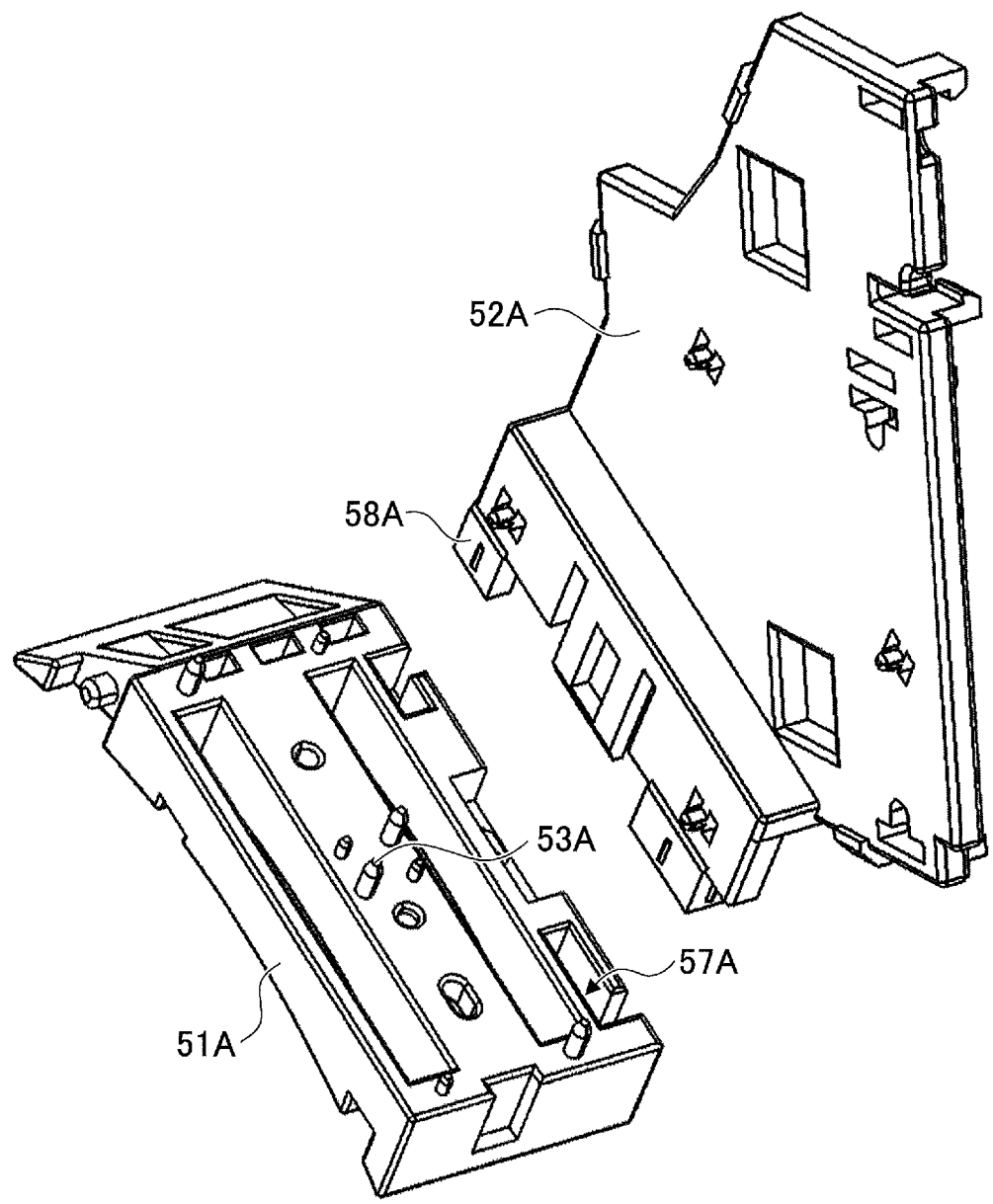
FIG. 9 is a disassembled perspective view illustrating another example of the lead block.

FIG. 9 is a disassembled perspective view illustrating another example of the lead block 5A. In the example illustrated in FIG. 9, one of the first block 51A and the second block 52A, namely, the first block 51A, is provided with the plurality of projections 53A on the surface thereof, and a plurality of recesses 57A provided at the end section thereof. On the other hand, the other of the first block 51A and the second block 52A, namely, the second block 52A, is provided with a plurality of projections 58A, provided at the end section thereof, to be inserted into the recesses 57A. By inserting the projections 58A into the recesses 57A, the second block 52A is fixed in a state approximately perpendicular with respect to the first block 51A. Alternatively, the recesses 57A may be provided in the second block 52A, and the projections 58A may be provided on the first block 51A. In addition, the lead block 5C may be formed to have a structure similar to that illustrated in FIG. 9.

FIG. 10A through FIG. 10F are side views illustrating each of steps of the method for assembling the lead block 5A illustrated in FIG. 9. The lead block 5C may be assembled by a method similar to the method for assembling the lead block 5A.

Figure 10A:
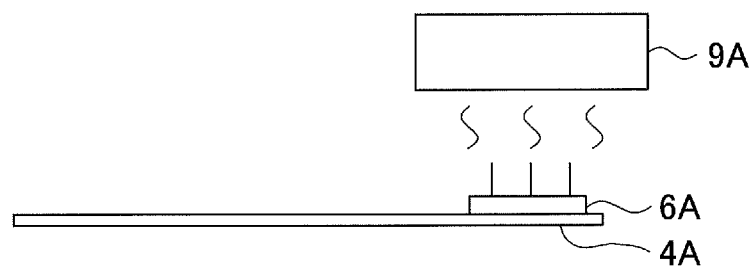
FIG. 10A is a side view illustrating each of steps of the method for assembling the lead block.

First, as illustrated in FIG. 10A, the external terminal 6A is electrically connected to the connecting section on the surface of the other end of the sub flat cable 4A by reflow soldering. More particularly, the external terminal 6A is arranged at a predetermined position on the surface of the other end of the sub flat cable 4A, and the periphery of the external terminal 6A is heated by the reflow heater 9A. A solder paste is coated in advance on the connecting section of the sub flat cable 4A to be electrically connected to the external terminal 6A. Hence, the external terminal 6A and the sub flat cable 4A are electrically connected by the solder.

Figure 10B:
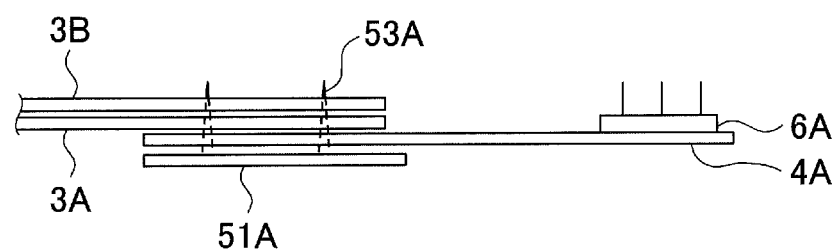
FIG. 10B is a side view illustrating each of steps of the method for assembling the lead block.

Next, as illustrated in FIG. 10B, the one end of each of the main flat cables 3A and 3B, and the one end of the sub flat cable 4A are arranged to overlap each other at a predetermined position on the surface of the first block 51A of the lead block 5A. The plurality of projections 53A are provided on the surface of the first block 51A, as described above. In addition, the plurality of holes corresponding to the plurality of projections 53A are provided at the one end of each of the main flat cables 3A and 3B and at the one end of the sub flat cable 4A. The main flat cables 3A and 3B, and the sub flat cable 4A are arranged so that the plurality of projections 53A are inserted through the holes provided at the end sections of the main flat cables 3A and 3B and the sub flat cable 4A. The main flat cables 3A and 3B, and the sub flat cable 4A may be overlapped in an arbitrary order.

Figure 10C:
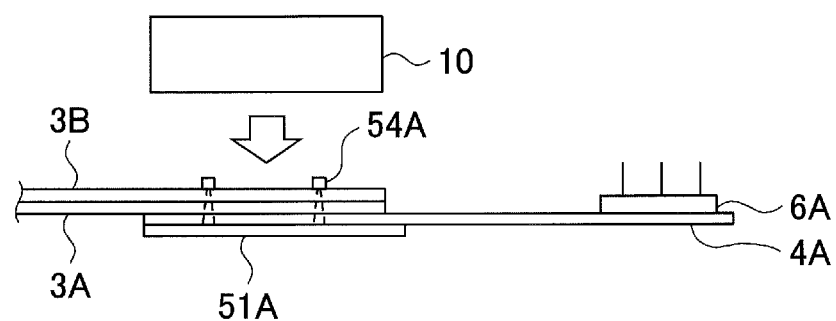
FIG. 10C is a side view illustrating each of steps of the method for assembling the lead block.

Next, as illustrated in FIG. 10C, the plurality of projections 53A are simultaneously crushed from immediately above using the caulking machine 10, to form the caulked sections 54A. The caulked sections 54A fix the connecting sections at the one end of each of the main flat cables 3A and 3B, and the connecting section at the one end of the sub flat cable 4A, to a predetermined position on the surface of the first block 51A in a state where no gap is formed among the connecting sections. At this point in time, the second block 52A is not connected to the first block 51A, and thus, the second block 52A does not interfere with the caulking machine 10, and the caulking machine 10 can simultaneously crush the plurality of projections 53A by approaching the entire surface of the first block 51A from immediately above.

Figure 10D:
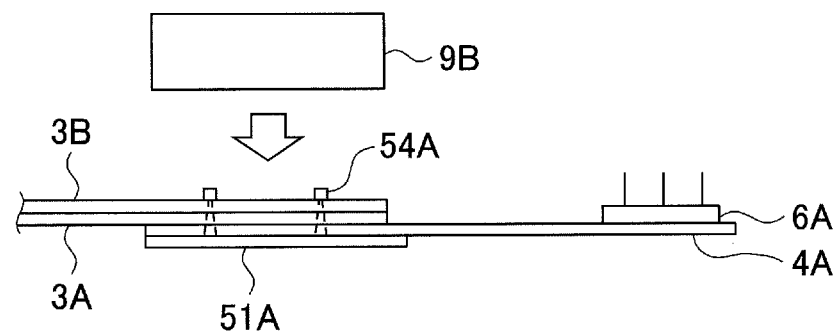
FIG. 10D is a side view illustrating each of steps of the method for assembling the lead block.

Next, as illustrated in FIG. 10D, the connecting sections at the one end of each of the main flat cables 3A and 3B, and the connecting sections at the one end of the sub flat cable 4A, are soldered. More particularly, the connecting sections are heated while being pressed from immediately above, by the soldering heater 9B. The connecting sections at the one end of each of the main flat cables 3A and 3B, and the connecting section at the one end of the sub flat cable 4A, are solder-plated in advance. Hence, the connecting sections at the one end of each of the main flat cables 3A and 3B, and the connecting section at the one end of the sub flat cable 4A, are electrically connected by the solder. At this point in time, the second block 52A is not connected to the first block 51A, and thus, the second block 52A does not interfere with the soldering heater 9B, and the soldering heater 9B can simultaneously solder a large area by approaching the entire surface of the first block 51A from immediately above.

Figure 10E:
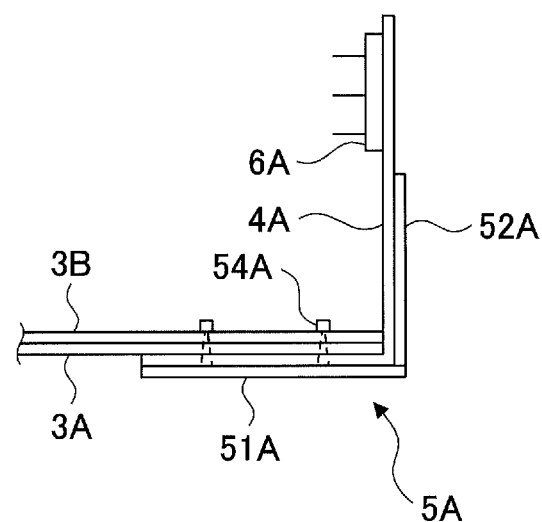
FIG. 10E is a side view illustrating each of steps of the method for assembling the lead block.

Then, as illustrated in FIG. 10E, the projections 58A of the second block 52A are inserted into the recesses 57A of the first block, so that the second block 52A is fixed in a state approximately perpendicular with respect to the first block 51.

Figure 10F:
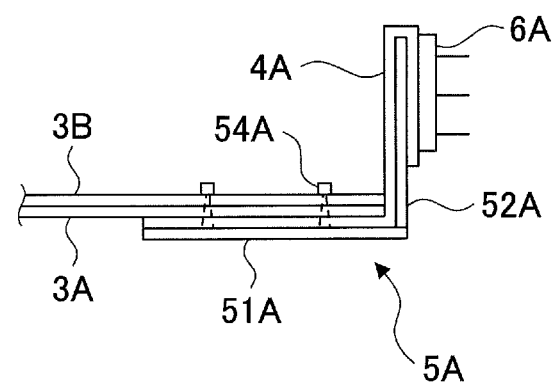
FIG. 10F is a side view illustrating each of steps of the method for assembling the lead block.

Thereafter, as illustrated in FIG. 10F, the external terminal 6A and the other end of the sub flat cable 4A are connected to one surface of the second block 52A by snap-fit connection or the like. Hence, the one end of each of the main flat cables 3A and 3B, the sub flat cable 4A, and the external terminal 6A are fixed to the lead block 5A.

Accordingly, in this embodiment, after assembling the lead block 5 as described above, the holder 7 is arranged on the lower stator 1B, the main flat cable 3 in the wound state is held by the holder 7, and the lead block 5 is arranged at a predetermined position. More particularly, the lead block 5A is arranged on the lower holding section 12B so that the external terminal 6A projects downward from the opening in the lower holding section 12B, and the lead block 5C is arranged on the lower holding section 13B so that the external terminal 6C projects downward from the opening in the lower holding section 13B. In addition, the lead block 5B is arranged on the holder 7 so that the external terminal 6B projects upward from the opening in the holding section 23, and the lead block 5D is arranged on the holder 7 so that the external terminal 6D projects upward from the opening in the holding section 24.

Thereafter, the upper stator 1A is connected to the lower stator 1B, to assemble the fixed housing 1. In addition, the upper rotor 2A and the lower rotor 2B are connected so as to sandwich the fixed housing 1, to assemble the movable housing 2. The assembling of the rotary connector 100 is completed by the above described steps.

Figure 11A:
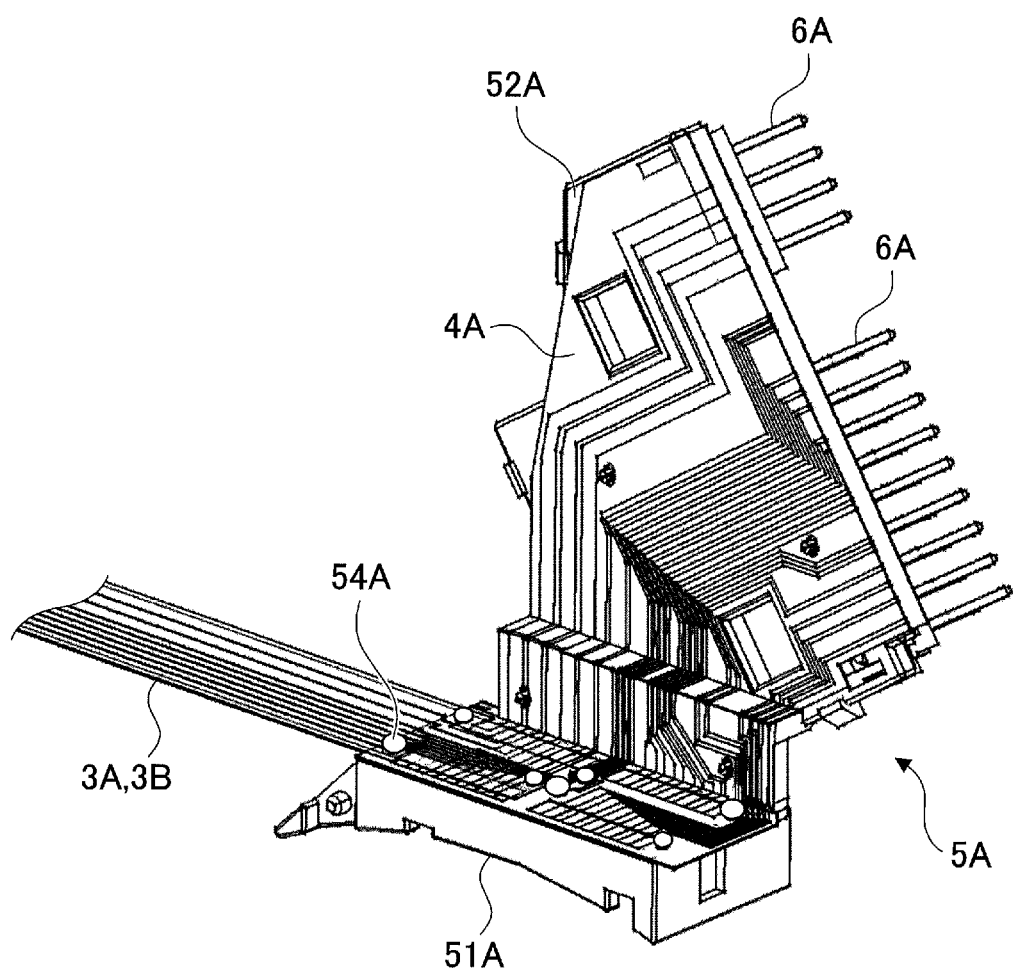
FIG. 11A is a perspective view illustrating the lead block in the state where the assembling is completed.
Figure 11B:
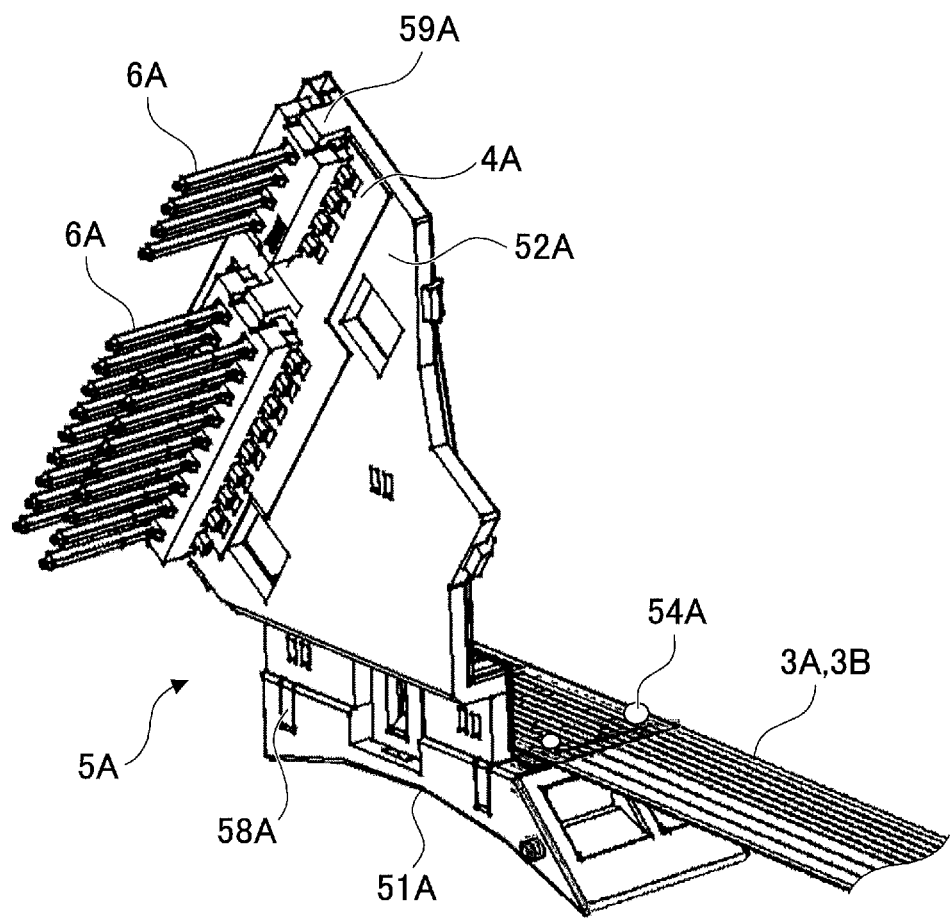
FIG. 11B is a perspective view illustrating the lead block in the state where the assembling is completed.

FIG. 11A and FIG. 11B are perspective views illustrating the lead block 5A in a state where the assembling is completed. FIG. 11A is the perspective view viewed from the front surface end, and FIG. 11B is the perspective view viewed from the rear surface end. The lead block 5A illustrated in FIG. 11A and FIG. 11B corresponds to the lead block 5A illustrated in FIG. 10F.

In the example illustrated in FIG. 11A and FIG. 11B, the connecting section at the one end of each of the main flat cables 3A and 3B, and the connecting section at the one end of the sub flat cable 4A, in the soldered state, are fixed to the surface of the first block 51A by the caulked sections 54A. The sub flat cable 4A is arranged from the surface of the first block 51A along the surface of the lead block 5A, and the other end of the sub flat cable 4A is folded back to the rear surface of the second block 52A. The connecting section at the other end of the sub flat cable 4A is electrically connected by solder to the external terminal 6A that is fixed to the rear surface of the second block 52A by the snap 59A. According to the assembling method of FIG. 10A through FIG. 10F, it is possible to assemble the lead block 5A as illustrated in FIG. 11A and FIG. 11B, using the reflow heater 9A, the soldering heater 9B, and the caulking machine 10.

As described heretofore, according to this embodiment, the main flat cable 3, the sub flat cable 4, and the external terminal 6 are connected by soldering, respectively. Because spot-welding is unnecessary to connect the main flat cable 3, the sub flat cable 4, and the external terminal 6, the rotary connector 100 can be assembled with ease.

In addition, according to this embodiment, the section for fixing the external terminal 6, that is, the lead block 5A that extends to the surface end of the section that fixes the main flat cable 3A, is formed by the two components that are the first block 51A and the second block 52A. According to this structure, it is possible to fix the main flat cable 3A and the sub flat cable 4A on the surface of the first block 51A, and the lead block 5A can be assembled after connecting the main flat cable 3A and the sub flat cable 4A by soldering. By assembling the lead block 5A in this manner, the soldering heater 9B can approach the surface of the first block 51A without interference from the second block 52A, and the main flat cable 3A and the sub flat cable 4A can easily be connected by soldering. Similarly, this holds true also for the lead block 5C.

The structure of the rotary connector 100 according to this embodiment is not limited to the above-mentioned examples. For example, the numbers of main flat cables 3, sub flat cables 4, lead blocks 5, rollers 73, and holding sections may be designed arbitrarily. In addition, the positions of the external terminal 6, and the direction in which the external terminal 6 projects may be designed arbitrarily. Moreover, the lead blocks 5B and 5D may be formed by two components, similar to the lead blocks 5A and 5C. Furthermore, the rotary connector 100 may be assembled by an operator, or may be assembled by an automatic machine, such as an industrial robot or the like. In addition, the main flat cable 3, the sub flat cable 4, and the external terminal 6 may be manually soldered by the operator using a soldering iron or the like, instead of performing the reflow soldering using the reflow heater 9A and the soldering heater 9B or the soldering using the automatic machine.

According to each embodiment of the present invention, it is possible to provide a rotary connector that is easy to assemble.

The present invention is not limited to the structures or the like of the embodiments illustrated above, and combinations with other elements may be made. In this respect, all examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A rotary connector comprising:
   a fixed housing having an outer cylindrical section;
   a movable housing, having an inner cylindrical section, and rotatably connected to the fixed housing;
   a main cable accommodated inside an annular space formed between the outer cylindrical section and the inner cylindrical section;
   a sub cable having one end connected to one end of the main cable and another end connected to an external terminal; and
   a lead block having a first block, to which the one end of the main cable and the one end of the sub cable are fixed, and a second block, which is fixed at an arrangement angle crossing an angle at which the first block is arranged, and to which the other end of the sub cable and the external terminal are fixed.

2. The rotary connector as claimed in claim 1, wherein the main cable and the sub cable are formed by a flexible printed circuit.

3. The rotary connector as claimed in claim 1, wherein the one end of the sub cable and the one end of the main cable are connected by solder.

4. The rotary connector as claimed in claim 2, wherein the one end of the sub cable and the one end of the main cable are connected by solder.

5. The rotary connector as claimed in claim 1, wherein one of the first block and the second block has a shaft section, and the other of the first block and the second block has a hook that hooks onto the shaft section.

6. The rotary connector as claimed in claim 2, wherein one of the first block and the second block has a shaft section, and the other of the first block and the second block has a hook that hooks onto the shaft section.

7. The rotary connector as claimed in claim 3, wherein one of the first block and the second block has a shaft section, and the other of the first block and the second block has a hook that hooks onto the shaft section.

8. The rotary connector as claimed in claim 1, wherein one of the first block and the second block has a recess, and the other of the first block and the second block has a projection that is inserted into the recess.

9. The rotary connector as claimed in claim 2, wherein one of the first block and the second block has a recess, and the other of the first block and the second block has a projection that is inserted into the recess.

10. The rotary connector as claimed in claim 3, wherein one of the first block and the second block has a recess, and the other of the first block and the second block has a projection that is inserted into the recess.

11. The rotary connector as claimed in claim 1, wherein the first block has a caulked section that fixes the one end of the main cable and the one end of the sub cable.

12. The rotary connector as claimed in claim 2, wherein the first block has a caulked section that fixes the one end of the main cable and the one end of the sub cable.

13. The rotary connector as claimed in claim 3, wherein the first block has a caulked section that fixes the one end of the main cable and the one end of the sub cable.

14. The rotary connector as claimed in claim 5, wherein the first block has a caulked section that fixes the one end of the main cable and the one end of the sub cable.

15. The rotary connector as claimed in claim 8, wherein the first block has a caulked section that fixes the one end of the main cable and the one end of the sub cable.

16. A method for assembling a rotary connector that includes
   a fixed housing having an outer cylindrical section,
   a movable housing, having an inner cylindrical section, and rotatably connected to the fixed housing,
   a main cable accommodated inside an annular space formed between the outer cylindrical section and the inner cylindrical section,
   a sub cable having one end connected to one end of the main cable and another end connected to an external terminal, and
   a lead block having a first block, to which the one end of the main cable and the one end of the sub cable are fixed, and a second block, which is fixed at an arrangement angle crossing an angle at which the first block is arranged, and to which the other end of the sub cable and the external terminal are fixed,
   the method comprising:
   connecting the one end of the main cable and the one end of the sub cable to a surface of the first block;
   soldering to connect the one end of the main cable and the one end of the sub cable; and
   fixing the second block at the arrangement angle crossing the angle at which the first block is arranged.

17. The method for assembling a rotary connector as claimed in claim 16, wherein the soldering connects one end of a first flexible printed circuit, as the main cable, to one end of a second flexible printed circuit, as the sub cable.

18. The method for assembling a rotary connector as claimed in claim 16, wherein the fixing includes hooking a hook of one of the first and second blocks to a shaft section of the other of the first and second blocks.

19. The method for assembling a rotary connector as claimed in claim 16, wherein the fixing includes inserting projections of one of the first and second blocks into corresponding holes in the other of the first and second blocks.

20. The method for assembling a rotary connector as claimed in claim 16, further comprising:
   fixing the one end of the main cable and the one end of the sub cable on the first block by caulking sections of the first block.

* * * * *